United States Patent [19]

EerNisse

[11] Patent Number: 5,030,876
[45] Date of Patent: Jul. 9, 1991

[54] MOUNTING STRUCTURE FOR CRYSTAL RESONATOR

[75] Inventor: Errol P. EerNisse, Salt Lake City, Utah

[73] Assignee: Quartztronics, Inc., Salt Lake City, Utah

[21] Appl. No.: 328,320

[22] Filed: Mar. 24, 1989

[51] Int. Cl.⁵ .......................................... H01L 41/08
[52] U.S. Cl. .................................................. 310/353
[58] Field of Search ........................ 310/351, 353, 346

[56] References Cited

U.S. PATENT DOCUMENTS

| | | | |
|---|---|---|---|
| 2,799,789 | 7/1957 | Wolfskill | 310/353 X |
| 3,069,572 | 12/1962 | Dick et al. | 310/353 |
| 3,263,103 | 7/1966 | Fraser et al. | 310/353 X |
| 4,266,157 | 5/1981 | Peters | 310/353 |
| 4,748,367 | 5/1988 | Bloch | 310/353 X |

Primary Examiner—Mark O. Budd
Attorney, Agent, or Firm—Thorpe, North & Western

[57] ABSTRACT

Structure for mounting a disc-shaped crystal, having a top and bottom surface, of a crystal resonator includes four attachment pads affixed to the crystal on the bottom surface near the perimeter thereof, four base pads affixed to a base surface, and four generally elongate parallel support elements, each extending from a different one of the base pads to a different one of the attachment pads to support the crystal. The support elements are generally longitudinally rigid and laterally elastic so that lateral movement of the crystal may take place without torque being applied to either the pads or the crystal. In other words, when the crystal is moved sideways, the plane of the crystal remains generally parallel with the previous plane occupied by the crystal.

22 Claims, 5 Drawing Sheets

MOUNTING STRUCTURE FOR CRYSTAL RESONATOR

BACKGROUND OF THE INVENTION

This invention relates to crystal resonators and more particularly to structure for mounting and supporting the crystal of a crystal resonator in a manner to reduce acceleration sensitivity.

Quartz crystal resonators have been in use for years as precise frequency sources in crystal-controlled oscillators. Such resonators typically consist of a disc-shaped quartz crystal supported at its perimeter by some type of mounting structure. Examples of prior art resonators are described in Besson, R. et al, "Design of Bulk Wave Quartz Resonator Insensitive to Acceleration", Proc. 33rd Annual Symposium on Frequency Control (1979) and Aubrey, J. P., et al, "Analyse des Mecanismes de Sensibilites Accelerometrique et Barometrique des Resonateurs a Quartz de Type QAS", *Fer Forum Europeen Temps-Frequence-* 1987.

Even though quartz crystal resonators exhibit a high degree of accuracy and stability, when the resonators are subject to acceleration, for example because of vibration, shock, gravity, etc., frequency shifts occur and this, of course, gives rise to error. Frequency shifts are caused by stress patterns set up in the crystal as a result of the crystal reacting against its mounting structure (or the mounting structure applying a force to the crystal) under acceleration. The stress patterns interact with the active region of vibration (see copending U.S. patent application, Ser. No. 07/103,670, filed Oct. 2, 1987) of a thickness shear vibration mode crystal to shift the resonant frequency.

Mounting structure presently used to mount resonator crystals is shown in FIGS. 1A and 1B. With this structure, metal strips 4 hold a crystal 8 at two or more (four shown in the drawing) locations around the perimeter of the crystal. Because of the rigidity of the strips 4 in the lateral or sideways direction, and the flexibility of the strips in the frontward and rearward directions, when a force is applied to the crystal 8 in the plane of the crystal (for example, a body force caused by gravity or acceleration) as shown in FIG. 1B, the strips and crystal bend (exaggerated) as shown. This bending of the crystal 8 affects how the strips share the load of the crystal. It is the load sharing that gives rise to stress patterns in the crystal which interact with the active region of vibration to shift the resonant mode frequency.

FIGS. 2A through 2C show the three in-plane stress patterns created in the crystal 8 when it is subjected to the body force shown in FIG. 1B acting in the $-x$ direction. FIG. 2A shows contours of extensional stress $T_{xx}$ (compression on the right side of the crystal 8 because strip 4a is pressing against the crystal and tension on the left side because strip 4b is pulling away from the crystal). The active region of vibration or mode 12 is shown as a dashed line. If the mode is as shown in FIG. 2A, i.e., at the geometric center, there are as many + (tension) contour lines as − (compression) contour lines encompassed by the mode, so the average stress in the mode is zero and there will be no effect on the frequency. If, however, the mode is off-center in the +x direction, there will be more + (positive) contour lines than − (negative) contour lines encompassed by the mode and there will be a frequency shift because the average stress is + (positive). Conversely, if the mode is off-center in the $-x$ direction, the opposite net stress occurs and the frequency shift is opposite.

FIG. 2B shows the extensional stress $T_{zz}$ for force acting the same as in FIG. 2A, i.e., in the $-x$ direction. This stress is produced primarily by strips 4c and 4d acting on the crystal 8. Once again, if the mode 12 (shown as a dashed line in FIG. 2B) is centered, the average stress is zero and there is no frequency shift. If the mode is off-center in the +x direction, there will be a frequency shift because the average stress in the active region of vibration becomes negative—because more negative side contour lines are encompassed by the mode than positive side contour lines. The converse applies for a mode off-center in the $-x$ direction.

FIG. 2C shows the third in-plane stress, which is shear stress $T_{xz}$, produced primarily by strips 4c and 4d acting against the crystal 8. The contour lines for this stress are at right angles to the contour lines of FIGS. 2A and 2B. Thus, if the mode 12 is off-center in either the + or − z direction, the average stress will not be zero and there will be a frequency shift.

Note from FIGS. 2A through 2C that the mode cannot be off-center in either the x or z direction without encompassing more positive than negative contour lines, or vice-versa, of one of the stresses $T_{xx}$ and $T_{zz}$, or $T_{xz}$ respectively. If the mode is off-center due to processing imperfections, there will be a frequency shift. Also, if the mounts are not perfectly symmetric in placement or bending rigidity, then even with the mode in the center, there will be frequency shift because the stress patterns will not be perfectly centered.

There are three other stresses, $T_{yy}$, $T_{xy}$, and $T_{zy}$, for gravity acting in the $-x$ direction but these are much smaller and their contribution to a frequency shift much less. Nevertheless, these stresses can affect the repeatability and accuracy of the resonator.

With the stress patterns as shown in FIGS. 2A–2C, the active region of vibration cannot be located off center in either the x direction or z direction without there being a nonzero average stress thus causing a frequency shift. This situation, however, is used to advantage in the aforecited copending patent application since movement of the active region of vibration so that it crosses contour lines can yield improved acceleration sensitivity, for example, in the x direction. Thus, so long as the acceleration takes place in the x direction, improved acceleration sensitivity is achieved. However, if acceleration of the crystal is likely to occur also, for example, in the z direction, then it may be necessary to further move the active region of vibration, for instance, in the z direction, to obtain improved acceleration sensitivity in that direction. Unfortunately, in most circumstances, this means that stress contour lines in the crystal for x direction acceleration will have been crossed by movement of the active region of vibration to accommodate the z direction acceleration and thus an undesirable frequency shift for x direction acceleration may be introduced. It would be desireable to be able to move the active region of vibration to improve sensitivity for acceleration in one direction without affecting the sensitivity to acceleration in another direction.

SUMMARY OF THE INVENTION

It is an object of the invention to provide a crystal resonator mounting structure which produces a less detrimental stress pattern in the crystal when the crystal is subjected to an in-plane acceleration, and thus produces less frequency shift.

It is also an object of the invention to provide such mounting structure which reduces acceleration sensitivity.

It is a further object of the invention to provide such mounting structure which allows for improved acceleration performance of the resonator and which is less sensitive to the location of the active region of vibration in the crystal.

It is an additional object of the invention to provide such mounting structure which facilitates movement of the active region of vibration in a crystal to improve sensitivity to acceleration in more than one direction.

The above and other objects of the invention are realized in a specific illustrative embodiment of mounting structure for a crystal resonator which includes four attachment pads affixed to the resonator crystal at its perimeter at generally symmetrically spaced-apart locations to define an imaginary first plane, and four base pads for affixing to a base surface to define an imaginary second plane which is generally parallel to the first plane. Also included are four generally elongate, parallel support legs, each extending from a different one of the base pads to a different one of the attachment pads to support the crystal, where the support legs are generally longitudinally rigid and laterally elastic so that with lateral movement of the crystal, the first plane remains generally parallel with the second plane.

In accordance with one aspect of the invention, each attachment pad is spaced from the adjacent attachment pads on either side around a disc-shaped crystal by an angle of B between about 75 degrees to 105 degrees for one adjacent attachment pad, and by an angle of about 180−B degrees for the other adjacent attachment pad.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 3:
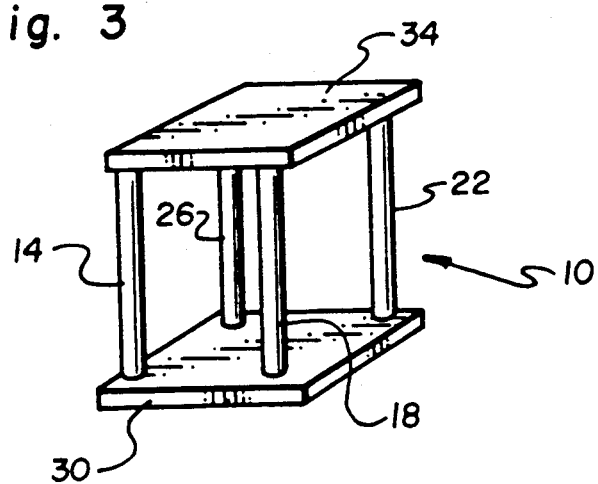
FIG. 3 is perspective view of mounting structure for a crystal resonator made in accordance with the principles of the present invention.

Referring to FIG. 3, there is shown one illustrative embodiment of a support element 10 for supporting the crystal of a crystal resonator to allow sideward movement of the crystal, for example, in response to acceleration, but with little resultant bending or torque being applied to the crystal. Because bending is minimized, the stress patterns produced in the crystal give rise to reduced in-plane (of the crystal) acceleration sensitivity and thus less frequency shift as a result of such acceleration.

The support element 10 includes four support posts 14, 18, 22 and 26, extending between a base pad 30, for attachment to a support surface, and a mounting pad 34, for attachment to the underside of a crystal. The posts 14 through 26 are made of material which is longitudinally rigid, but laterally flexible and resilient to allow sideward movement of the mounting pad 34. The posts 14 through 26 are disposed apart from one another to form the corners of a parallelogram—which, in the case of the embodiment of FIG. 3, is a square. Exemplary material from which the posts 14 through 26 might be made is stainless steel, platinum-tungsten alloy, etc. The pads 30 and 34, which may be made of a similar material as the posts, are joined to the posts 14 through 26 by a suitable adhesive.

Figure 4:
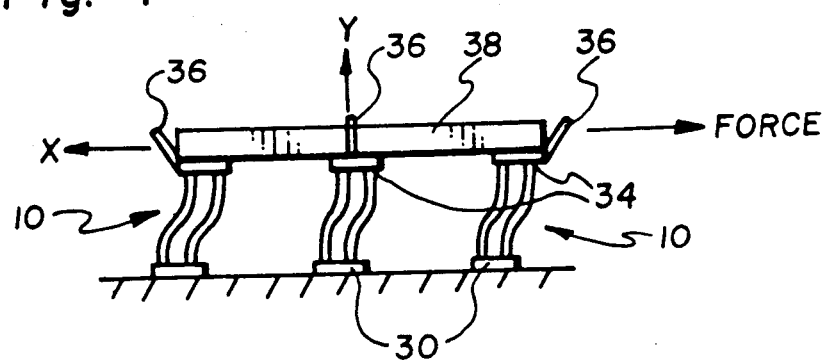
FIG. 4 is side view illustrating the effects of a force supplied to a crystal supported by the mounting structure of FIG. 3.

FIG. 4 shows a crystal 38 mounted on four (three are shown) of the support elements 10, where the crystal is being forced to the right (in the −x direction) for example by gravity or acceleration. Because the mounting pads 34 stay generally parallel with the base pads 30 even though moved sideways, very little bending interaction takes place between the crystal 38 and the support elements 10. That is, the plane defined by the mounting pads 34 (and crystal 38) is maintained substantially parallel with the plane defined by base pads 30. As a result, the stress patterns created in the crystal 10 are less inimical to maintaining a stable frequency in the crystal.

The mounting structure of FIG. 4 also includes guide fingers 36, each projecting upwardly and outwardly from a different one of the mounting pads 34 as shown. The guide fingers 36 are provided to guide and urge the crystal 38 into a centered position on the support elements 10 so that the crystal can be quickly and easily secured, for example, by a suitable adhesive, to the support elements. The guide fingers 36 could advantageously be formed integral with the mounting pads 34 and of the same material.

Figure 5:
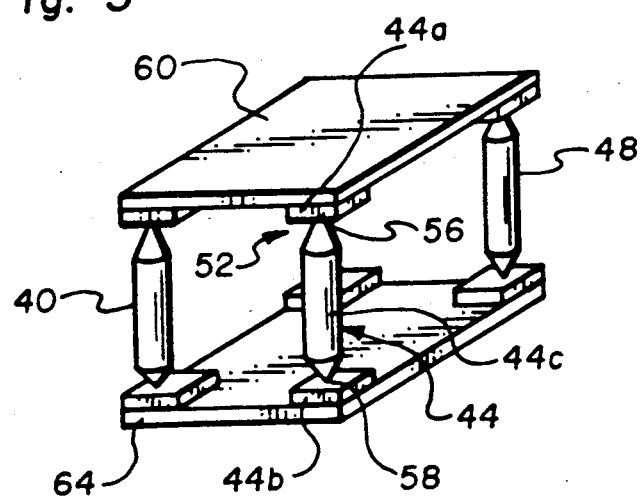
FIG. 5 is another embodiment of crystal resonator mounting structure made in accordance with the principles of the present invention.

FIG. 5 shows another embodiment of mounting structure for crystal resonators. This structure includes four posts or legs 40, 44, 48 and 52 (not shown) spaced-apart from one another to define the corners of a square. Each leg includes a head section 44a, foot section 44b and intermediate, elongate section 44c, all of which are rigid except for two fulcrums 56 and 58 which respectively join the upper end of the intermediate section 44c to the head section 44a and the lower end of the intermediate section to the foot section 44b. The fulcrums 56 and 58 are flexible and resilient to allow lateral movement of the head section 44a relative to the foot section 44b. A rigid upper plate 60 and rigid lower plate 64 are attached to the head sections and foot sections respectively of the legs 40, 44, 48 and 52 to be generally parallel with one another. A force applied to the upper plate 60 in the plane of the plate will cause the plate to move laterally in the direction of the force, where the plate remains parallel with the lower plate 64. The mounting structure of FIG. 5 could be used to support crystals of a crystal resonator in the same manner as shown for the support elements 10 of FIG. 4. Again, in-plane forces on the crystal would result in very little bending or torque on the crystal. Advantageously, legs 40, 44, 48 and 52 are made of a suitable polymer.

Figure 1A:
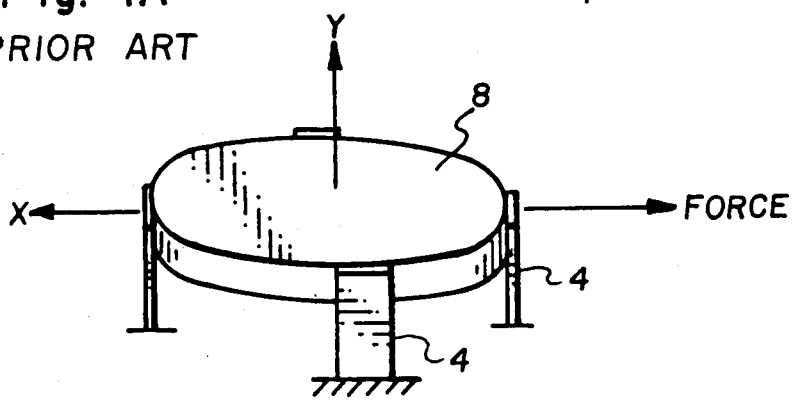
FIGS. 1A and 1B show a perspective view and side view respectively of prior art mounting structure for a crystal resonator.
Figure 1B:
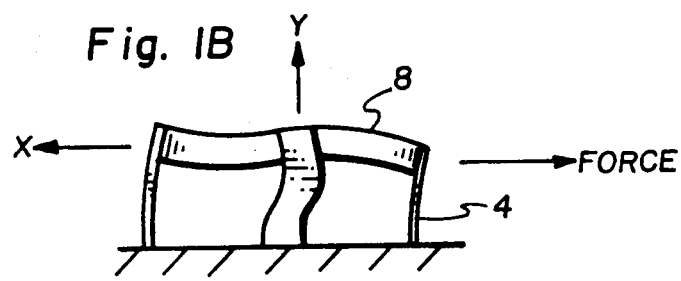
Figure 2A:
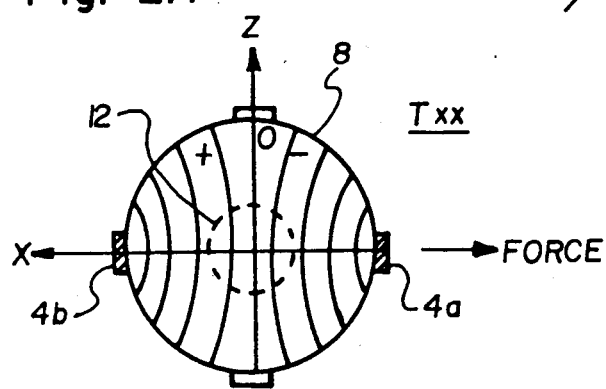
FIGS. 2A, 2B and 2C are top plan views of a crystal resonator graphically showing stress contour lines $T_{xx}$, $T_{zz}$ and $T_{xz}$ respectively, produced by interaction of the crystal with prior art mounting structure when the crystal is subjected to an inplane force.
Figure 2B:
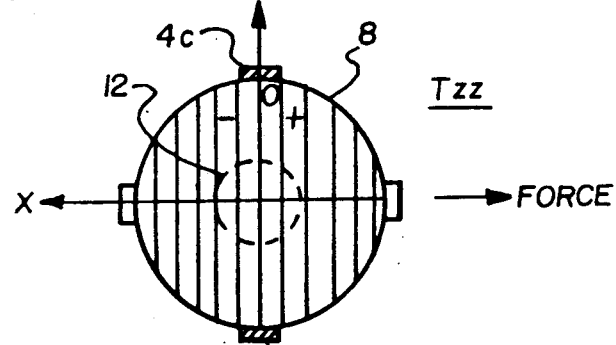
Figure 2C:
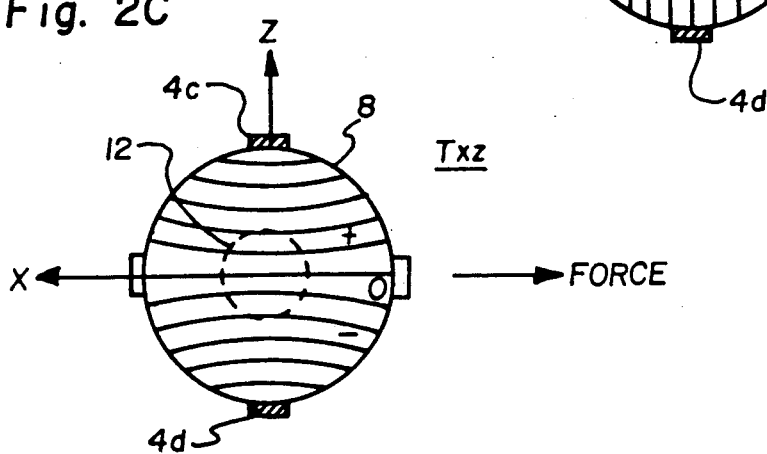
Figure 6:
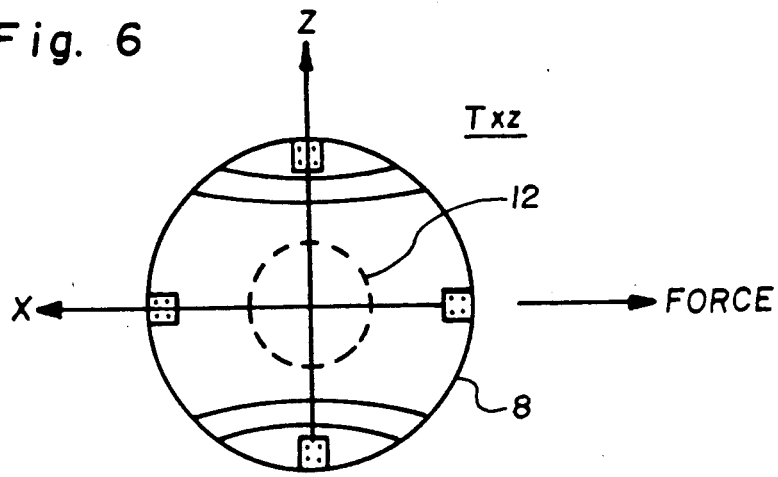
FIG. 6 is a top plan view of a crystal supported by the mounting structure of the present invention and illustrating stress contour lines $T_{xz}$.
Figure 7:
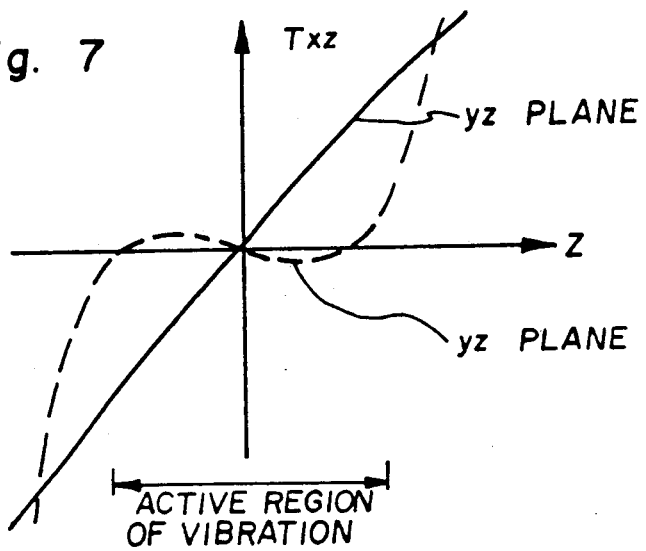
FIG. 7 is a graph illustrating the yz plane cross-section of the FIG. 2C stress pattern and of the FIG. 6 stress pattern.

FIGS. 6 and 7 illustrate the effects of using the mounting structure of FIGS. 3 through 5 on the $T_{xz}$ stress pattern of the crystal 8. Referring to FIG. 6, it can be seen that there is a reduction in the number of stress contour lines that appear during acceleration in the vicinity of the active region of vibration 12. Because of this, the resonant frequency of vibration of the crystal 8 is more stable when subjected to an in-plane force. FIG. 7 shows a yz plane cross-section of the $T_{xz}$ stress contours for the FIG. 2C stress pattern (solid line) and for the FIG. 6 stress pattern (dashed line). Note that the slope of $T_{xz}$ along the z direction for the FIG. 2C stress pattern is steep, whereas with the new mounting arrangement and the FIG. 6 stress pattern, the slope of $T_{xz}$ is substantially zero across the area of the active region of vibration. What this means is that there is an abundance of stress contour lines in the active region of vibration for the FIG. 2C stress pattern but there are substantially no stress contour lines in the active region of vibration for the FIG. 6 stress pattern. Thus, the active region of vibration can be located slightly off-center of the crystal in FIG. 6 in any direction and not cause any appreciable change in the average $T_{xz}$ stress. Thus, again, there will be little frequency shift in the crystal due to $T_{xz}$ stress when the crystal is subjected to an in-plane acceleration.

Figure 8:
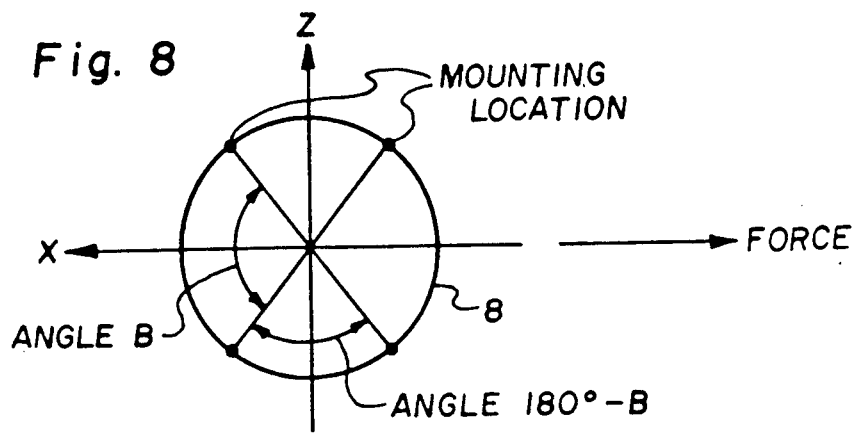
FIG. 8 is a graphic top plan view of a crystal illustrating locations for placement of mounting structure about the perimeter of the crystal, in accordance with the principles of the present invention.
Figure 9:
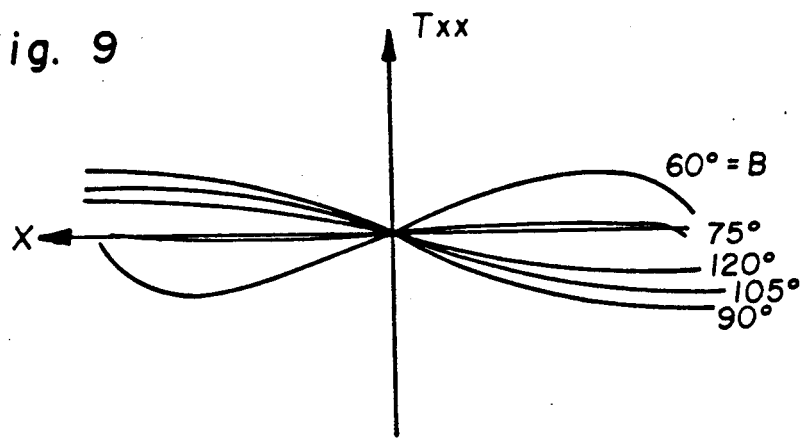
FIGS. 9, 10 and 11 are graphs showing plots of the stresses $T_{xx}$, $T_{zz}$ and $T_{xz}$ respectively versus various angles B of the arrangement of FIG. 8.
Figure 10:
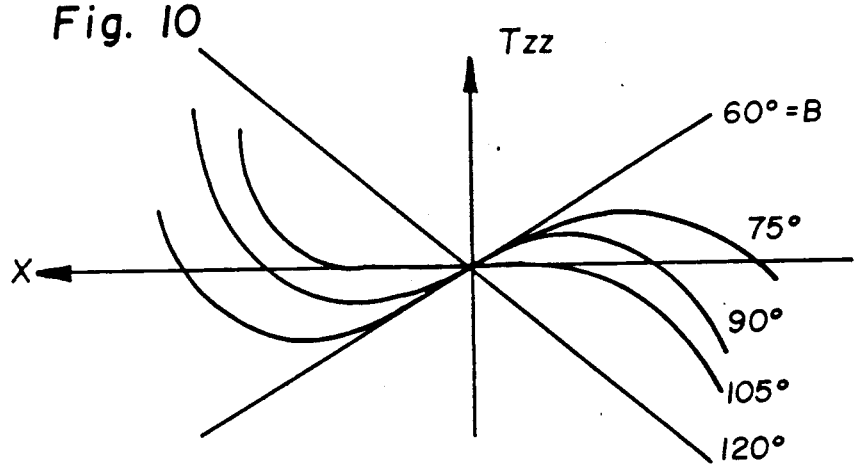

FIG. 8 shows exemplary locations at which four mounting supports might advantageously be placed to support the crystal 8. In particular, each mount is spaced about the perimeter of the crystal 8 from one of its adjacent mounts by an angle B, whereas the other adjacent mount is spaced about the crystal perimeter at an angle 180°−B, as shown. Each of the left pair and right pair of the mounts straddle the geometric x axis along which the force is acting. For an in-plane force applied to the crystal 8 along the −x direction, the stresses $T_{xx}$, $T_{zz}$ and $T_{xz}$ are plotted in FIGS. 9 through 11 for different angles B. It can be seen in FIG. 9 that for an angle B between 60 degrees and 120 degrees, the stresses $T_{xx}$ are relatively flat. But, in FIG. 10, the stresses $T_{zz}$ have some slope for the angle B=60 degrees and 120 degrees, but such slope is reduced significantly for angle B between 75 degrees and 105 degrees. Thus, for the angle B between 75 degrees and 105 degrees, both $T_{xx}$ and $T_{zz}$ are relatively flat.

Figure 11:
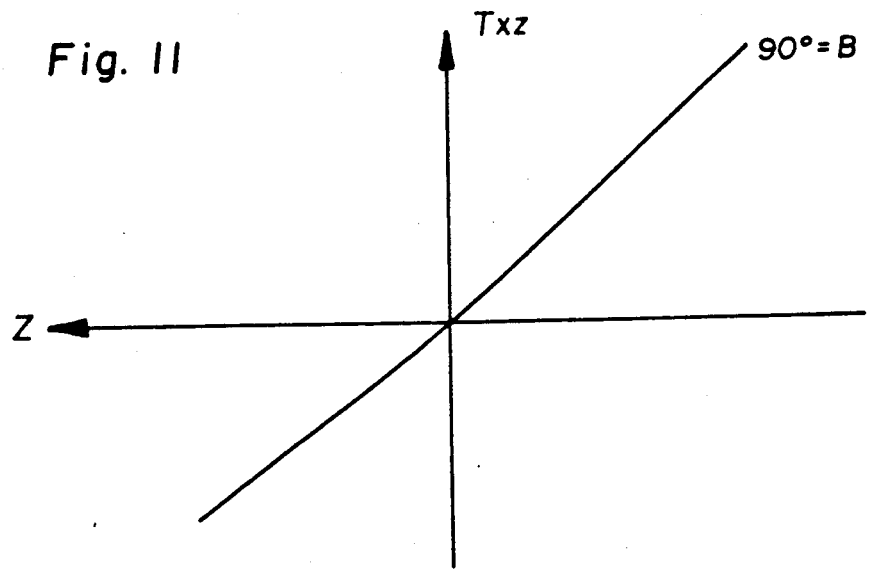

Although FIG. 11 shows a plot of stress $T_{xz}$ along the Z-axis for only B=90°, the general trend of $T_{xz}$ is similar for B between 60° and 120°. Thus a location of the active region of vibration off-center along the z axis will cross contour lines resulting in a frequency shift. It appears that the creation of a "plateau" in the various stress patterns leaves either $T_{xz}$ or the pair $T_{xx}$ and $T_{zz}$ with no plateaus, i.e., an abundance of contour lines. The advantage of the present invention is that it eliminates one direction of concern for the location of the mode.

Figure 12:
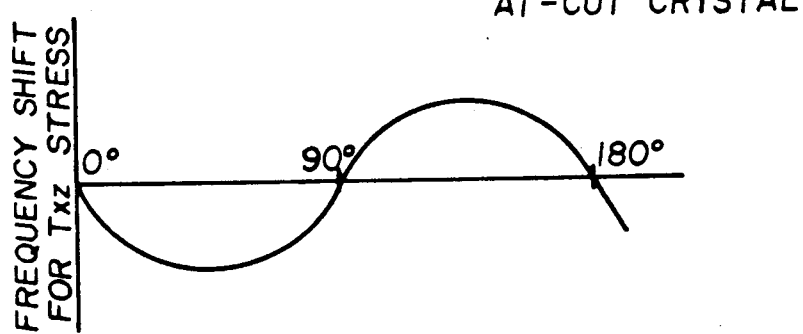
FIG. 12 shows a graph of the coefficient for the frequency shift caused by the stress $T_{xz}$ for an AT-Cut crystal versus the angle between the geometric x axis shown in FIG. 8 and the crystallographic x axis of the AT-Cut crystal.

It has been found for specific type crystals that the judicious placement of the mounts of a four mount arrangement can substantially reduce the frequency shift which might otherwise be caused by in-plane forces being applied to the crystal. For example, for the AT-cut crystal, it has been found that placement of the mounts 90 degrees apart around the crystal perimeter so that two pairs of the mounts straddle the crystallographic x axis, yields an arrangement whose frequency shift is very small in the face of in-plane forces being applied to the crystal. This is illustrated in FIG. 12 which shows the frequency shift for $T_{xz}$ stress versus the angle between the crystallographic x axis and the geometric x axis. If this angle is 0 degrees or 90 degrees, the $T_{xz}$ frequency shift is zero.

Figure 13:
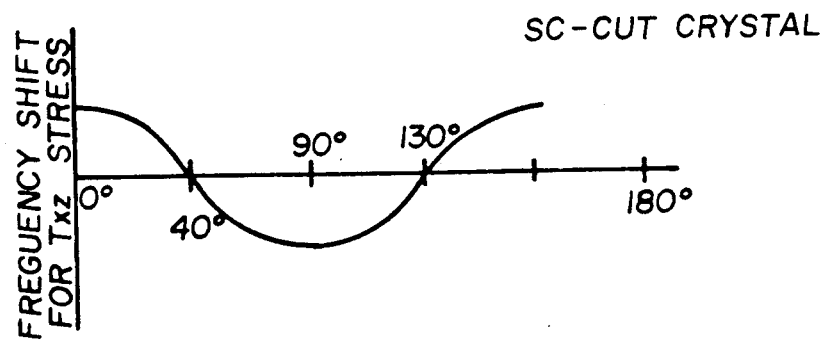
FIG. 13 shows a graph of the coefficient for the frequency shift caused by the stress $T_{xz}$ for an SC-Cut crystal versus the angle between the geometric x axis shown in FIG. 8 and the intersection of the crystal disc and the xy crystallographic plane of the crystal disc.

For an SC-cut crystal, it has been found that placement of the mounts so as to straddle the geometric x axis which, in turn, is 40 degrees or 130 degrees spaced from the crystallographic x' axis gives a reduced frequency shift for in-plane forces applied to the crystal. FIG. 13 shows the frequency shift for $T_{xz}$ stress versus the angle between the x geometric axis and the X' axis which is the intersection of the plane defined by the crystal with the xy crystallographic plane. Note that for the angles 40 degrees and 130 degrees, the frequency shift is zero.

It can now be seen that the present invention allows for easy application of the method for reducing acceleration sensitivity disclosed in the co-pending U.S. patent application. With the prior art mounts, contour lines in the stress patterns will be crossed no matter what direction the active region of vibration is moved, for instance, by the addition of mass to selected areas of the crystal. In the present invention, only one direction is available to cross contour lines as the active region is relocated. The second direction may be used for adjusting the sensitivity to acceleration in the second direction. Of course, the choice of the crystallographic orientation of the mounts will be somewhat different than the zero crossings shown in FIGS. 12 and 13 because some change in acceleration sensitivity is desired for relocating the active region of the crystal.

As previously mentioned, the stresses $T_{yy}$, $T_{xy}$, and $T_{yz}$, are also present, but smaller in magnitude. The stress $T_{yy}$ is related to $T_{xx}$ and $T_{zz}$ by Poison's ratio effects, so when $T_{xx}$ and $T_{zz}$ are plateaued, so also is $T_{yy}$. Also $T_{xy}$ and $T_{yz}$ are proportional to the amount of bending in the crystal. Since the present invention minimizes the bending, $T_{xy}$ and $T_{yz}$ are also minimized.

Finally, the third possible direction for acceleration to act is normal to the crystal plane. The present invention substantially eliminates rotation at the edges of the crystal, so the amount of bending is reduced. Thus, the present invention improves all aspects of the acceleration sensitivity of crystal resonators.

The embodiments shown here are meant to be only representative of the invention. The principles apply to materials other than quartz and other mounting structures that reduce the bending of the crystal.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. Mounting structure for supporting the crystal of a crystal resonator so as to reduce acceleration sensitivity of the crystal, where the crystal is formed with a generally thin side profile having a top and bottom surface, said mounting structure comprising four contact elements affixable to the crystal at the perimeter thereof at generally symmetrically spaced-apart locations, and four laterally resilient and longitudinally rigid, generally elongated leg means, each connected at one end to a respective element and each including means for supporting the crystal to allow lateral movement thereof when the crystal is subjected to acceleration, and means for substantially inhibiting the application of torque from said each leg means to the respective element and crystal.

2. mounting structure as in claim 1 wherein said elements are disposed in a common plane at the location of affixation to the crystal, and wherein sideward movement of the crystal results in the elements being positioned in new common planes all generally parallel to one another.

3. Mounting structure as in claim 2 further comprising four base elements each attached to the other end of a respective leg means, said base elements defining a common plane, and wherein said leg means interconnect the contact elements with the base elements such that when the crystal is moved sidewards, the plane defined by the contact elements is maintained generally parallel with the plane defined by the base elements.

4. Mounting structure as in claim 1 wherein each of said leg means comprises four generally longitudinally rigid, parallel posts extending between a corresponding contact element and base element, and spaced apart from one another to define the corners of a parallelogram.

5. Mounting structure for supporting the crystal of a crystal resonator, where the crystal is formed with a generally thin side profile having a top and bottom surface, said mounting structure comprising four contact elements affixed to the crystal at the perimeter thereof at generally symmetrically spaced-apart locations, four laterally resilient, generally elongated leg means, each connected at one end to a respective element to allow lateral movement of said one end with respect to the other end and thus allow sideward movement of the elements and crystal substantially without torque being applied to the elements or crystal, and four base elements each attached to the other end of respective leg means, said base elements defining a common plane, wherein said leg means interconnect the contact elements with the base elements such that when the crystal is moved sidewards, the plane defined by the contact elements is maintained generally parallel with the plane defined by the base elements, and wherein each of said leg means comprises at least one generally longitudinally rigid elongate post extending between a corresponding contact element and base element, said post having two spaced-apart fulcrums to enable resilient multi-directional lateral bending of the post at the fulcrums, one of said fulcrums being located near the contact element and the other of said fulcrums being located near the base element.

6. Mounting structure as in claim 1 wherein said contact elements are affixed to the bottom surface of the crystal.

7. Mounting structure as in claim 6 further comprising four guide means, each formed on a different contact element for registering with the edge of the crystal to locate the crystal on the contact elements.

8. Mounting structure as in claim 1 wherein each contact element is spaced apart from the adjacent contact elements on either side by an angle of B between about 75 degrees to 105 degrees about the perimeter of the crystal for one adjacent contact element, and by an angle of about 180° - B for the other adjacent contact element.

9. Mounting structure as in claim 8 wherein the angle between adjacent contact elements is about 90 degrees.

10. Mounting structure as in claim 8 wherein the crystal is an AT-cut quartz crystal, and wherein selected adjacent contact elements are disposed an equal distance on each side of the crystallographic x axis of the crystal.

11. Mounting structure as in claim 10 wherein the angle B is about 90°.

12. Mounting structure as in claim 8 wherein the crystal is an SC-cut quartz crystal, and wherein selected adjacent contact elements are disposed an equal distance on each side of an imaginary line which forms an angle of about 40 degrees with the crystallographic x' axis of the crystal.

13. Mounting structure as in claim 12 wherein the angle B is about 90°.

14. Structure for mounting the crystal of a crystal resonator wherein the crystal is disk-shaped having a top and bottom surface, said structure comprising four attachment pads affixed to the crystal at the perimeter at generally symmetrically spaced-apart locations, said pads being disposed in an imaginary first plane, four base pads for affixing to a base surface, said base pads being disposed in an imaginary second plane which is generally parallel with the first plane, and four generally elongate parallel support means, each extending from a different one of the base pads to a different one of the attachment pads to support the crystal, said support means each comprising at least two generally parallel posts which are longitudinally rigid and laterally elastic so that lateral movement of the crystal will maintain the first plane generally parallel to the second plane, substantially without torque being applied to the attachment pads or crystal.

15. Structure as in claim 14 wherein each support means comprises four parallel posts which are laterally resilient along the length thereof extending from a corresponding one of the base pads to a corresponding one of the attachment pads, and spaced apart from one another to define the corners of a parallelogram.

16. Structure as in claim 14 wherein each support means comprises four parallel post extending from a corresponding one of the base pads to a corresponding one of the attachment pads, said posts each having two spaced-apart fulcrums to enable resilient multidirectional lateral bending of the posts at the fulcrums, one of the fulcrums of said each post being located near the base pad to which said each post is attached and the other fulcrum of said each post being located near the attachment pad to which said each post is attached, said four posts being spaced apart from one another to define the corners of a parallelogram.

17. Structure as in claim 14 further comprising four guide means, each formed on a different attachment pad to extend upwardly therefrom to locate the crystal onto the attachment pads.

18. Structure as in claim 14 wherein each attachment pad is spaced from the adjacent attachment pads on either side around the crystal by an angle of B between about 75 degrees to 105 degrees for one adjacent attachment pad, and by an angle of about 180°- B for the other adjacent attachment pad.

19. Structure as in claim 18 wherein the angle B is about 90 degrees.

20. A crystal resonator comprising a crystal formed with a generally thin side profile having a top and bottom surface, and four laterally resilient, generally elongated support means, each joined at one end to the bottom surface of the crystal near the perimeter thereof at generally symmetrically spaced-apart locations about the crystal, to allow lateral movement of said one end with respect to the other end so that the crystal may move sidewards substantially without rotation of the edges of the crystal, each of said support means comprising at least two generally parallel, transversely spaced-apart posts.

21. A crystal resonator as in claim 20 wherein each of said leg means comprises four generally parallel posts spaced apart from one another to define the corners of a parallelogram.

22. Mounting structure as in claim 5 wherein each of said leg means comprises four generally parallel posts spaced apart from one another to define the corners of a parallelogram.

* * * * *